(12) United States Patent
Kanouff et al.

(10) Patent No.: US 6,198,792 B1
(45) Date of Patent: Mar. 6, 2001

(54) WAFER CHAMBER HAVING A GAS CURTAIN FOR EXTREME-UV LITHOGRAPHY

(75) Inventors: Michael P. Kanouff; Avijit K. Ray-Chaudhuri, both of Livermore, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/187,911

(22) Filed: Nov. 6, 1998

(51) Int. Cl.$^7$ ........................................... G21K 5/00
(52) U.S. Cl. ............................................ 378/34; 250/492.2
(58) Field of Search .............................. 378/34; 250/492.2

(56) References Cited

U.S. PATENT DOCUMENTS

| | | |
|---|---|---|
| 4,185,202 | 1/1980 | Dean et al. . |
| 4,648,106 | * 3/1987 | Novak ..................................... 378/34 |
| 5,267,292 | 11/1993 | Tanaka et al. . |

FOREIGN PATENT DOCUMENTS

| | | |
|---|---|---|
| 0174877A2 | 3/1986 | (EP) . |
| 0532968A1 | 3/1993 | (EP) . |
| 0957402A2 | 11/1999 | (EP) . |

\* cited by examiner

*Primary Examiner*—Craig E. Church
(74) *Attorney, Agent, or Firm*—Burns, Doane, Swecker & Mathis L.L.P.

(57) ABSTRACT

An EUVL device includes a wafer chamber that is separated from the upstream optics by a barrier having an aperture that is permeable to the inert gas. Maintaining an inert gas curtain in the proximity of a wafer positioned in a chamber of an extreme ultraviolet lithography device can effectively prevent contaminants from reaching the optics in an extreme ultraviolet photolithography device even though solid window filters are not employed between the source of reflected radiation, e.g., the camera, and the wafer. The inert gas removes the contaminants by entrainment.

25 Claims, 4 Drawing Sheets

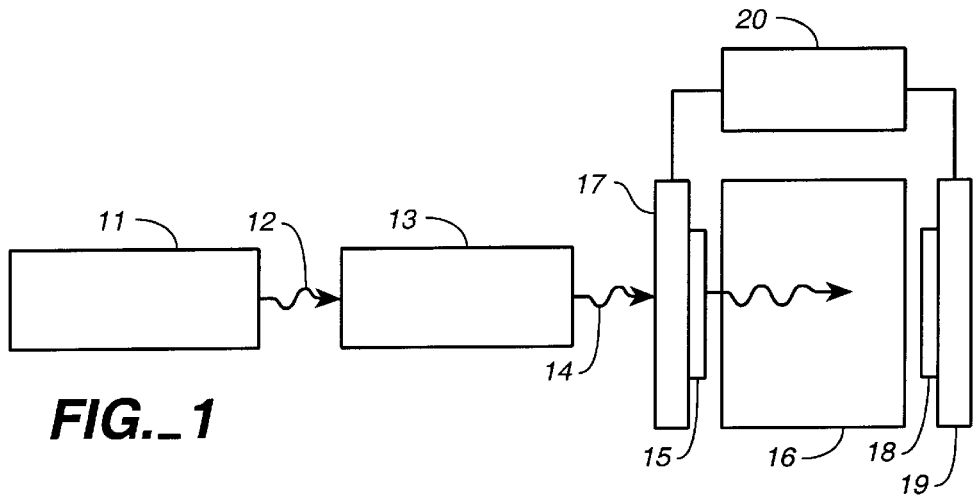
FIG._1
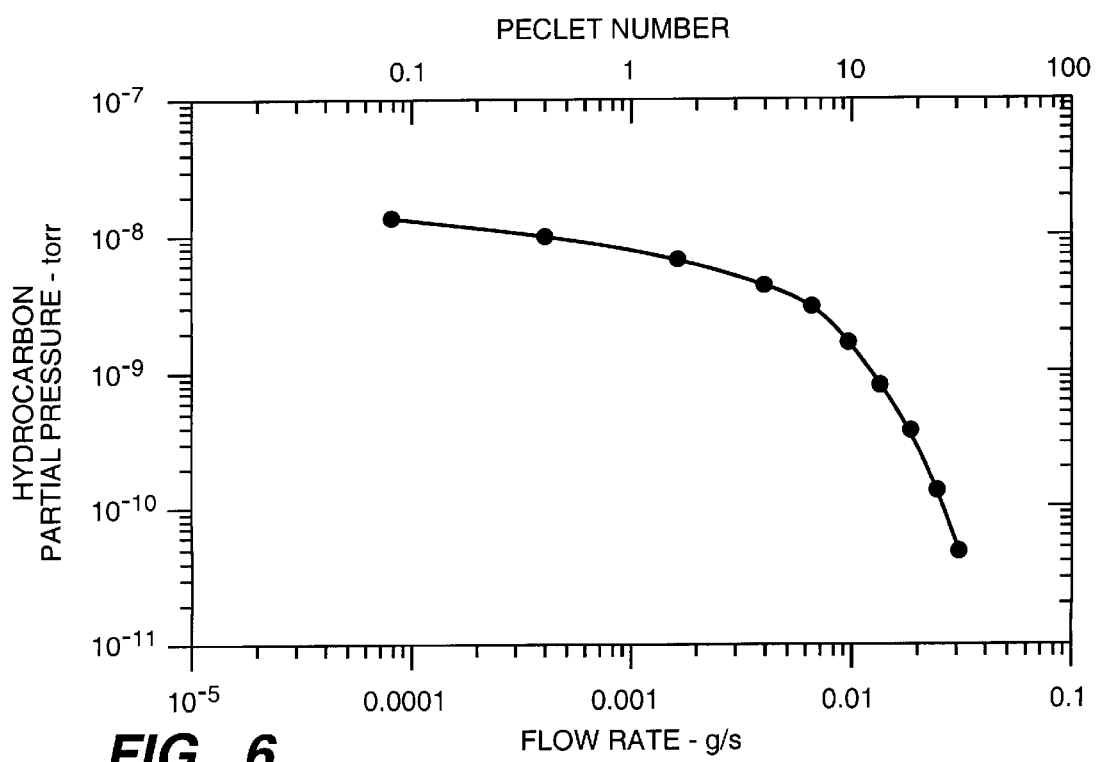
FIG._6

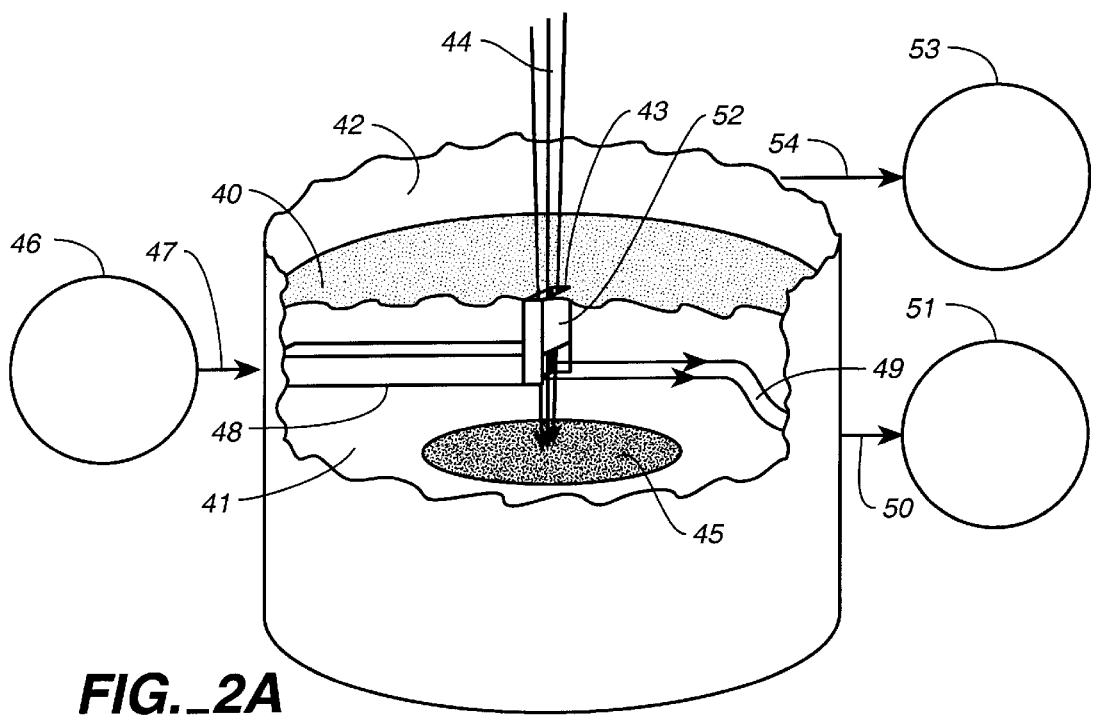
FIG._2A
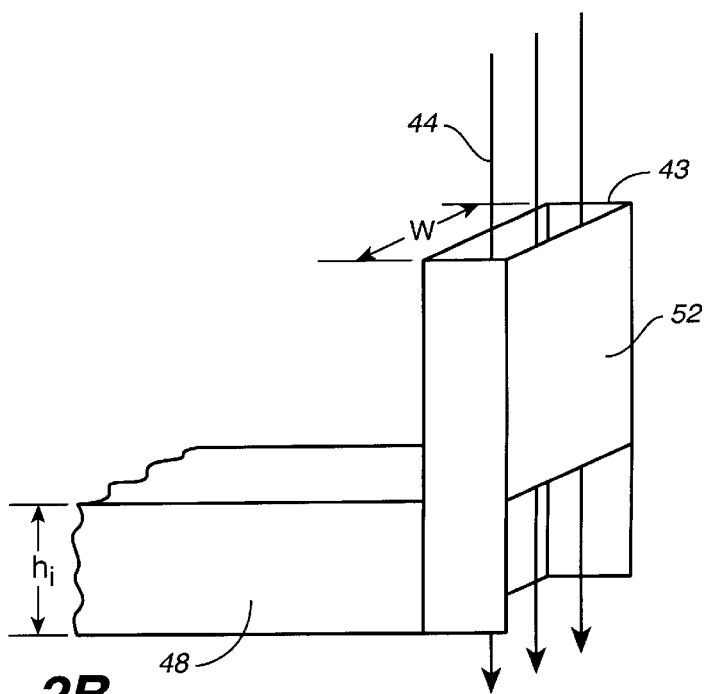
FIG._2B

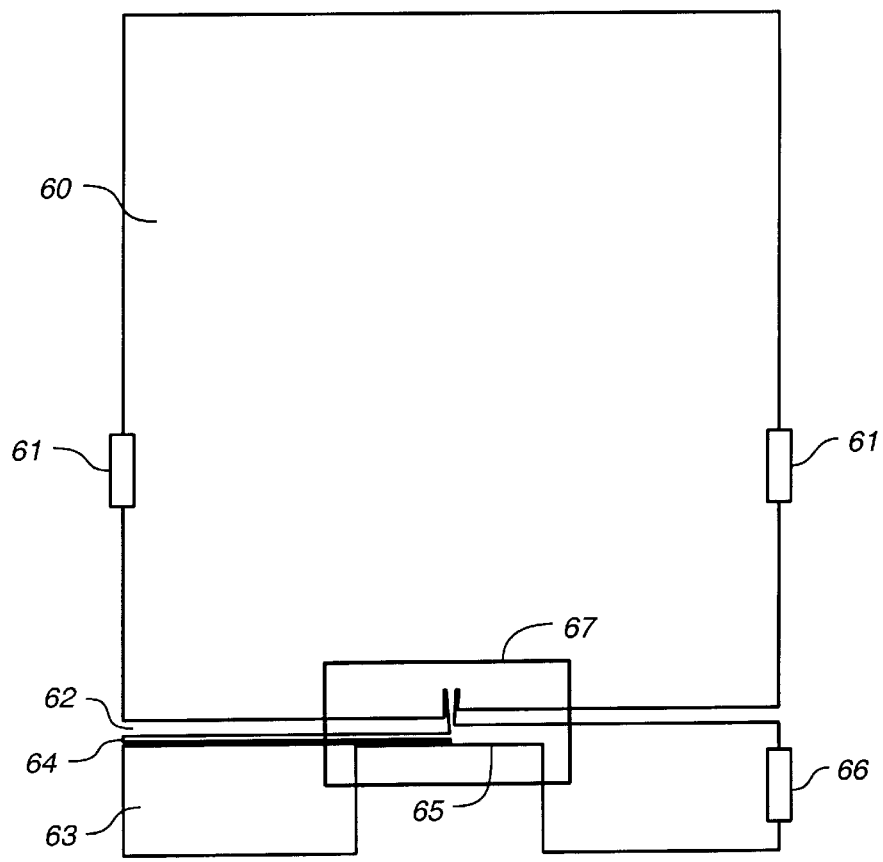
FIG._3A
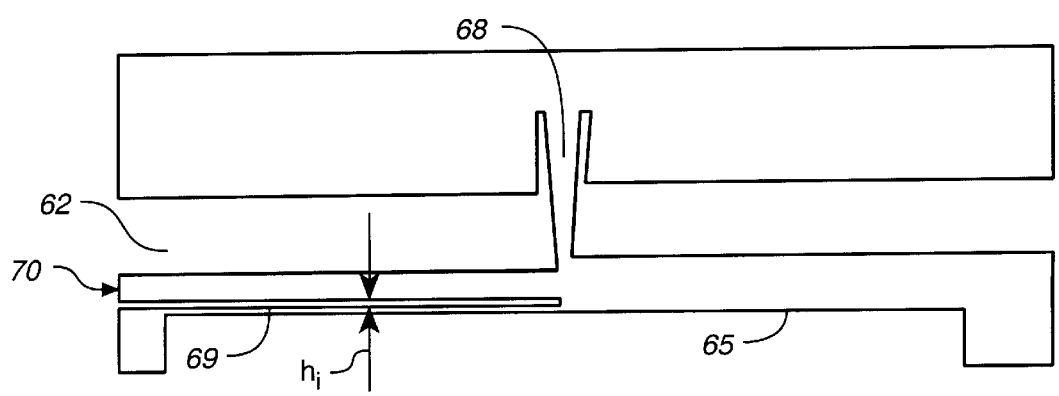
FIG._3B

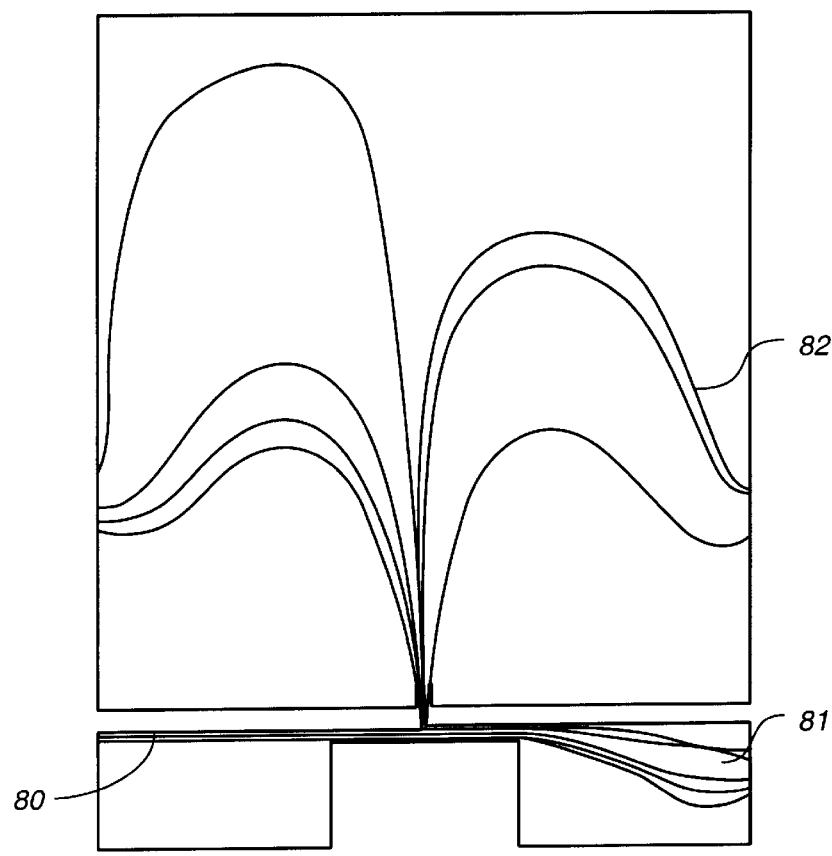
FIG._4
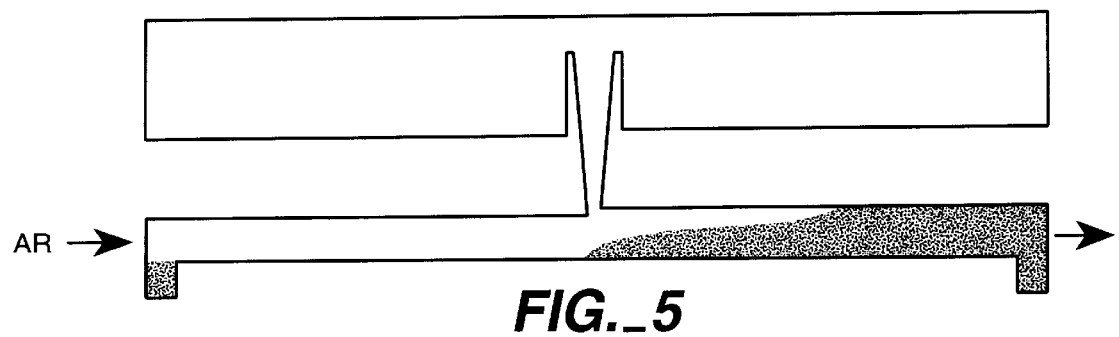
FIG._5

WAFER CHAMBER HAVING A GAS CURTAIN FOR EXTREME-UV LITHOGRAPHY

The U.S. Government has a paid-up license in this invention and the right in limited circumstances to require the patent owner to license others on reasonable terms as provided for by the terms of Contract No. DE-AC04-94AL85000 awarded by the Department of Energy.

FIELD OF THE INVENTION

The invention relates to projection lithography employing soft x-rays and in particular to methods of preventing contaminants generated by the wafer from depositing onto the surfaces of mirrors and lens. The invention is especially suited for systems that use a camera that images with acuity along a narrow arc or ringfield. The camera uses the ringfield to scan a reflective mask and translate a pattern onto the surface of the wafer.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft", x-rays (a.k.a. Extreme UV) (wavelength range of $\lambda=100$ to $200$ Å ("Angstrom")) are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning, e.g., Jewell et al., U.S. Pat. No. 5,315,629 and Offner, U.S. Pat. No. 3,748,015, available condensers that can efficiently couple the light from a synchrotron source to the ringfield required by this type of camera have not been fully explored. Furthermore, full field imaging, as opposed to ringfield imaging, requires severely aspheric mirrors in the camera. Such mirrors cannot be manufactured to the necessary tolerances with present technology for use at the required wavelengths.

The present state-of-the-art for Very Large Scale Integration ("VLSI") involves chips with circuitry built to design rules of 0.25 μm. Effort directed to further miniaturization takes the initial form of more fully utilizing the resolution capability of presently-used ultraviolet ("UV") delineating radiation. "Deep UV" (wavelength range of $\lambda=0.3$ μm to $0.1$ μm), with techniques such as phase masking, off-axis illumination, and step-and-repeat may permit design rules (minimum feature or space dimension) of 0.18 μm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths.

Two x-ray radiation sources are under consideration. One source, a plasma x-ray source, depends upon a high power, pulsed laser (e.g., a yttrium aluminum garnet ("YAG") laser), or an excimer laser, delivering 500 to 1,000 watts of power to a 50 μm to 250 μm spot, thereby heating a source material to, for example, 250,000° C., to emit x-ray radiation from the resulting plasma. Plasma sources are compact, and may be dedicated to a single production line (so that malfunction does not close down the entire plant). Another source, the electron storage ring synchrotron, has been used for many years and is at an advanced stage of development. Synchrotrons are particularly promising sources of x-rays for lithography because they provide very stable and defined sources of x-rays.

Electrons, accelerated to relativistic velocity, follow their magnetic-field-constrained orbit inside a vacuum enclosure of the synchrotron and emit electromagnetic radiation as they are bent by a magnetic field used to define their path of travel. Radiation, in the wavelength range of consequence for lithography, is reliably produced. The synchrotron produces precisely defined radiation to meet the demands of extremely sophisticated experimentation. The electromagnetic radiation emitted by the electrons is an unavoidable consequence of changing the direction of travel of the electrons and is typically referred to as synchrotron radiation. Synchrotron radiation is comprised of electromagnetic waves of very strong directivity emitted when electron or positron particles, traveling within the synchrotron at near light velocity, are deflected from their orbits by a magnetic field.

Synchrotron radiation is emitted in a continuous spectrum or fan of "light", referred to as synchrotron emission light, ranging from radio and infrared wavelengths upwards through the spectrum, without the intense, narrow peaks associated with other sources. Synchrotron emission light has characteristics such that the beam intensity is high, and the divergence is small so that it becomes possible to accurately and deeply sensitize a photolithographic mask pattern into a thickly applied resist. Generally, all synchrotrons have spectral curves similar to the shape shown in FIG. 1 of Cerrina et al. (U.S. Pat. No. 5,371,774) that define their spectra. The particular intensity and critical photon energy will vary among different synchrotrons depending upon the machine parameters.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem. Necessary absence of optics in-between the mask and the wafer necessitates a high level of parallelism (or collimation) in the incident radiation. X-ray radiation of wavelength $\lambda \leq 16$ Å is required for 0.25 μm or smaller patterning to limit diffraction at feature edges on the mask.

Use has been made of the synchrotron source in proximity printing. Consistent with traditional, highly demanding, scientific usage, proximity printing has been based on the usual small collection arc. Relatively small power resulting from the 10 mrad to 20 mrad arc of collection, together with the high-aspect ratio of the synchrotron emission light, has led to use of a scanning high-aspect ratio illumination field (rather than the use of a full-field imaging field).

Projection lithography has natural advantages over proximity printing. One advantage is that the likelihood of mask damage is reduced, which reduces the cost of the now larger-feature mask. Imaging or camera optics in-between the mask and the wafer compensate for edge scattering and, so, permit use of longer wavelength radiation. Use of extreme ultra-violet radiation (a.k.a., soft x-rays) increases the permitted angle of incidence for glancing-angle optics. The resulting system is known as extreme UV ("EUVL") lithography (a.k.a., soft x-ray projection lithography ("SXPL")).

A favored form of EUVL is ringfield scanning. All ringfield optical forms are based on radial dependence of aberration and use the technique of balancing low order aberrations, i.e., third order aberrations, with higher order aberrations to create long, narrow illumination fields or annular regions of correction away from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width is a function of the smallest feature to be printed with increasing residual astigmatism, distortion, and Petzval curvature at distances greater or smaller than the design radius being of greater consequence for greater resolution. Use of such an arcuate field allows minimization of radially-dependent image aberrations in the image. Use of object:image size reduction of, for example, 5:1 reduction, results in significant cost reduction of the, now, enlarged-feature mask.

It is expected that effort toward adaptation of electron storage ring synchrotron sources for EUVL will continue. Economical high-throughput fabrication of 0.25 μm or smaller design-rule devices is made possible by use of synchrotron-derived x-ray delineating radiation. Large angle collection over at least 100 mrad will be important for device fabrication. Design of collection and processing optics for the condenser is complicated by the severe mismatch between the synchrotron light emission pattern and that of the ringfield scan line.

Aside from the quality of the optics that are employed in EUVL systems, other factors that influence the quality of the wafers fabricated include the ability of the systems to prevent contaminants from depositing onto the surfaces of lens and mirrors and other optical devices. A source of contaminants are the hydrocarbons generated by the wafer upon exposure to radiation. Hydrocarbon deposits on the projection optics will reduce system EUV through put. Non-uniform hydrocarbon deposits on the reticle will cause linewidth variations.

Prior art x-ray lithography devices comprise multi-chamber apparatuses wherein the enclosure housing the wafer stage is separated from the source of projected x-rays by a solid filter window. The window effectively acts as a barrier to potential gaseous contaminants from entering the enclosure(s) housing the devices upstream from the wafer stage, however, the window tends to absorb a considerable fraction of the EUV thereby reducing the amount of radiation reaching the wafer. A silicon window 0.5 μm thick will absorb about 50% of the EUV. The art is in search of methods of reducing the level of EUV absorption without significantly increasing the level of gaseous contaminants that reach the upstream devices.

SUMMARY OF THE INVENTION

The present invention is based on the recognition that maintaining an inert gas curtain in the proximity of a wafer can effectively prevent contaminants from reaching the optics in an EUVL device even though solid filter windows are not employed between the source of reflected radiation, e.g., camera, and the wafer. The inert gas, e.g., helium, removes the contaminants by entrainment.

Accordingly, in one aspect the invention is directed to an apparatus for forming an optical image of a mask pattern on a wafer that includes:

a first chamber housing a wafer to be exposed to extreme ultraviolet (EUV) radiation to form a pattern image on the wafer;

a second chamber that is separated from the first chamber by a partition or barrier which defines an aperture that is permeable to gas and that houses an image system, which is disposed between the mask having a pattern for circuit manufacturing and the wafer, for receiving EUV radiation reflected from the mask and directing it to the wafer through the aperture; and means for maintaining a flow of inert gas over the wafer surface to remove contaminants that develop from the wafer upon exposure to the EUV radiation.

In another aspect, the invention is directed to a method for forming an optical image of a mask pattern on a wafer that includes the steps of:

(a) providing a photolithographic system that comprises:
   (i) a first chamber housing a wafer that is sensitive to extreme ultraviolet (EUV) radiation and which is to be exposed to EUV radiation to form a pattern image on the wafer; and
   (ii) a second chamber that is separated from the first chamber by a partition or barrier which defines an aperture which is permeable to inert gas and that houses an image system, which is disposed between the mask having a pattern for circuit manufacturing and the wafer;

(b) exposing the mask to EUV radiation which is at least partially reflected onto a surface of the wafer, to form a pattern image on the wafer surface; and (c) maintaining a flow of inert gas over the wafer surface to remove contaminants that develop from the wafer upon exposure to the EUV radiation.

In a further aspect, the invention is directed to a process for fabrication of a device comprising at least one element having a dimension ≦0.25 µm, such process comprising construction of a plurality of successive levels, construction of each level comprising lithographic delineation, in accordance with which a subject mask pattern is illuminated to produce a corresponding pattern image on the device being fabricated, ultimately to result in removal of or addition of material in the pattern image regions, in which illumination used in fabrication of at least one level is extreme ultraviolet radiation, characterized in that the process employs a chamber that houses a wafer that is exposed to extreme ultraviolet radiation to form a pattern image on the wafer wherein a flow of inert gas is maintained over the wafer surface to remove contaminants that develop from the wafer upon exposure to the radiation.

Modeling suggests that the inert gas can effectively remove hydrocarbon gas contaminants by entrainment so that the optical devices that are positioned upstream from the wafer are not adversely affected.

BRIEF DESCRIPTION OF THE DRAWINGS

FIG. 1 is a schematic of the main elements of an exemplary photolithography apparatus;

FIGS. 2A and 2B illustrate a portion of a vacuum system with a partition dividing the system into two chambers and the mechanism to create the gas curtain;

FIGS. 3A and 3B show a two-dimensional model of an embodiment of a vacuum system, which model was used to calculate the performance of the gas curtain;

FIG. 4 depicts the gas flow streamlines of the gas curtain in the vacuum system;

FIG. 5 is an enlargement of the wafer showing the distribution for the hydrocarbon mass fraction in the vacuum system in the vicinity of the wafer; and FIG. 6 is a graph of the hydrocarbon partial pressure in the upper chamber of the vacuum system vs. the gas flow rate and Peclet number for the gas curtain.

DETAILED DESCRIPTION OF THE INVENTION

FIG. 1 schematically depicts an apparatus for EUV lithography that comprises a radiation source 11, such as a synchrontron or a laser plasma source, that emits x-rays 12 into condenser 13 which in turn emits beam 14 that illuminates a portion of reticle or mask 15. The emerging patterned beam is introduced into the imaging optics 16 which projects an image of mask 15, shown mounted on mask stage 17, onto wafer 18 which is mounted on stage 19. Element 20, an x-y scanner, scans mask 15 and wafer 18 in such direction and at such relative speed as to accommodate the desired mask-to-image reduction.

As described in further detail herein, the wafer is housed in a wafer chamber that is separated from the other elements of the photolithography system located upstream as illustrated in FIG. 1. These other elements can be housed in one or more chambers which are preferably maintained in vacuum to minimize attenuation of the x-rays. EUV radiation projected from the mask and translated by the camera travels through an aperture in the wafer chamber. With the present invention, this aperture does not employ a solid filter window, e.g., one that is fabricated from soft x-ray transmitting materials.

The EUV lithography device of the present invention is particularly suited for fabricating integrated devices that comprise at least one element having a dimension of ≦0.25 µm. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

The individual elements that form the EUV lithography device as shown in FIG. 1 can comprise conventional optical devices, e.g., condensers, cameras, and lens, for projection EUV lithography. Preferably the EUVL device employs a condenser that collects soft x-rays for illuminating a ringfield camera. A particularly preferred EUVL device that employs a condenser having a diffraction grating on the surface of a mirror upstream from the reflective mask that enhances critical dimension control is described in Sweatt et al., U.S. patent application Ser. No. 09/130,224 entitled "Diffractive Element in Extreme-UV Lithography Condenser" filed on Aug. 6, 1998, which is incorporated by reference. The condenser illustrated therein has the ability to separate the light from a line or quasi point source at the entrance pupil into several separated lines or transform point foci that are still superimposed on each other at the ringfield radius, thus maximizing the collection efficiency of the condenser and smoothing out any inhomogeneities in the source optics.

FIGS. 2A and 2B illustrate the vacuum enclosure housing the elements depicted in FIG. 1, and the associated devices for the gas curtain. The partition 40 (shown as the partial cut-away) stretches horizontally across the enclosure and divides it into a lower chamber 41 and an upper chamber 42. This partition 40 serves to help prevent the contaminants in the lower chamber 41 from entering the upper chamber 42. Contaminants of primary concern are gaseous hydrocarbons that formed when a wafer typically having a layer of photoresist thereon is exposed to EUV radiation. The partition 40 has an aperture 43 to allow the EUV radiation 44 to pass through from the upper chamber 42 into the lower chamber 41. This aperture 43 is preferably formed at the center directly above the middle of the wafer stage; the aperture is of sufficient size to allow the EUV ray bundle to pass through to the wafer. The aperture 43 is the only potential path for contaminants from the lower chamber 41 to enter the upper chamber 42, as the partition is sealed along the perimeter. The gas curtain is positioned to prevent or minimize the amount of contaminants flowing through this path. In addition, the area of the aperture 43 should be kept to a minimum to help reduce the amount of gas that enters the upper chamber 42. Preferably, the aperture has an opening with an area of 1 cm$^2$ to 5 cm$^2$. In one embodiment, the opening is a slit having a width of 0.4 cm to 1.5 cm and a length of 2.6 cm to 3.7 cm.

Lower chamber 41 houses a wafer stage 45, and the upper chamber 42 houses the other devices, e.g., camera and condenser, that are upstream of the wafer stage as shown in FIG. 1. It is understood that instead of employing the single upper chamber 42, additional chambers can be employed since it may be more convenient or desirable to isolate the various devices of the projection photolithography system in separate chambers with different environments.

An inert gas curtain is created immediately below the aperture 43 to prevent or at least minimize the flow of hydrocarbon gases through the aperture to the upper chamber 42. Inert gas flows from a source 46 through a duct 47 which connects with the inert gas inlet duct 48 in the lower chamber 41. The inert gas inlet duct 48 extends horizontally to a point as close to the EUV radiation path as practical without actually interfering with this path, as shown in FIG. 2B. The inert gas flows through the inlet duct 48, from left to right, and exits the right end of the duct which is adjacent to the path of the EUV radiation. The inert gas flows horizontally across the path of the EUV above the wafer and entrains the hydrocarbon gas coming from the wafer. The resulting gas mixture continues to flow horizontally in the lower chamber 41 to the right, as shown by path 49. This gas mixture exits the lower chamber 41 through outlet duct 50 which is connected to a vacuum device 51. A vacuum typically in the range of 0.005 torr to 0.5 torr is established within the lower chamber 41.

In general, the inlet duct 48 has some clearance above a wafer that is positioned on wafer stage 45. The clearance is preferably 2 mm to 10 mm, and preferably there is a similar clearance beneath the partition 40. A 'chimney' or conduit 52 bridges the gap between the inlet duct 48 and the partition 40 such that it prevents the hydrocarbon gas coming from the wafer from flowing upward and around the inert gas inlet duct and through the aperture 43 to the optics in the upper chamber 42. In general, the pressure in the lower chamber 41 is larger than the pressure in the upper chamber 42. This results in some of the inert gas exiting the inert gas inlet duct 48 from flowing up through the chimney 52 and into the upper chamber 42. Gases in the upper chamber 42 which may come from the gas curtain or may be out gassed from various sources in the upper chamber are evacuated from the upper chamber through one or more outlet ducts 54 connected to vacuum devices 53. A vacuum typically in the range of $10^{-6}$ torr to 0.005 torr is established within the upper chamber 42.

As illustrated in FIG. 2B, aperture 43 for the EUV has an elongated contour with width w, that matches the outer contour of the EUV beam that is projected from the mask and translated by the camera into the wafer chamber. The width of the inert gas inlet duct 48 is preferably the same as the aperture 43 in the partition 40. The vertical dimension of the inert gas inlet duct is $h_i$, as shown in FIG. 2B.

The inert gas can comprise any gas that does not interfere with the operation of the projection photolithography device, e.g., gas(es) with good x-ray transmission in vacuum conditions. Suitable gases include, for example, hydrogen, helium, argon, oxygen and mixtures thereof.

Preferably, the flow of inert gas over the wafer is at a rate such that the mass transfer Peclet number (a non-dimensional quantity given by $Vh_i/D$, where V is the gas velocity, $h_i$ is the vertical dimension of the inert gas inlet duct, and D is the diffusivity of the hydrocarbon gas in the inert gas) has a value between 20 and 35. This can be achieved by using the proper the gas flow rate, duct size, type of gas, or any combination thereof. A typical set of values for these are: (i) a gas flow rate of 0.025 g/sec to 0.05 g/sec and preferably about 0.03 g/sec, (ii) a duct with a vertical height of 1 cm to 5 cm and preferably 4 cm and a width of 2 cm to 4 cm and preferably 2.92 cm, and argon for the inert gas.

Modeling was employed to determine the effectiveness of using the gas curtain to protect the projection optics located in the upper chamber from hydrocarbon contamination. The calculations were based on a two-dimensional model of a specific vacuum enclosure illustrated in FIGS. 3A and 3B, wherein the inner width of the enclosure is 1.06 m, and the height of the apparatus is 1.37 m. The upper chamber 60 has two gas outlets 61. The partition 62 separates the upper chamber 60 from the lower chamber 63. The inlet 64 for the inert gas flow is on the left side of the lower chamber 63, and the wafer 65 is located 18 cm from the bottom of the lower chamber. The lower chamber 63 has an outlet 66 on the right side. For the calculations, the upper chamber 60 was empty, i.e., the model does not include the projection optics. The region 67 of FIG. 3A is shown enlarged in FIG. 3B.

Portions of the partition 62 and wafer 65 are shown in FIG. 3B along with the aperture 68. In this model, the upper boundary wall of the inert gas inlet duct 70 is provided by the partition 62, and the lower wall 69 of the inlet duct has a 1 mm clearance above the wafer 65. The vertical height of the inlet duct 70 is $h_i$.

The calculations considered an argon gas curtain positioned directly above the wafer 65, the source of the hydrocarbon in an attempt to entrain the hydrocarbon in the argon flow and to convect it out of the vacuum enclosure. The results from the calculations show that the partial pressure of the hydrocarbon in the upper chamber decreases as the Peclet number, $Pe=Vh_i/D$, increases, where V is the velocity of the argon above the wafer, $h_i$ is the dimension of the argon inlet duct, and D is the mass diffusivity.

Calculations are carried out for the momentum, energy, and mass transport in the vacuum enclosure where a gas curtain is used to prevent hydrocarbons out gassed from the wafer from entering into the upper chamber. The compressible form of the gas dynamic equations were solved. The calculations assume that the momentum and mass transport processes are governed by the continuum equations and the transport processes are two dimensional.

Equations 1–4 show the non-dimensional, steady state forms of the governing continuity, momentum, energy, and mass transport equations.

$$\nabla \cdot \rho V = 0 \quad\quad\quad 1$$

$$Re\ A\rho(V\cdot\nabla)V = -\nabla p - \nabla \tau \quad\quad\quad 2$$

$$Pe\ A\rho(V\cdot\nabla)T = \nabla^2 T - Br\ p(\nabla\cdot V) + Br(\tau:\nabla V) \quad\quad\quad 3$$

$$Pe_m\ A\nabla\cdot(\rho Vy) = \nabla^2(\rho y) \quad\quad\quad 4$$

In these equations $\nabla$, $\rho$, V, p, T, y and $\tau$ are the dimensionless forms of the 'del-operator', density, velocity vector, pressure, temperature, mass fraction and viscous stress tensor, respectively. The equation parameters are the aspect ratio, $A=\delta_y/\delta_x$, the Reynolds number, $Re=V_c\delta_y\rho_c/\mu$, the heat transfer Peclet number, $Pe=V_c\delta_y\rho_c c_v/k$, the Brinkman number, $Br=\mu V_c^2/(k\Delta T)$, and the mass transfer Peclet number, $Pe_m=V_c\delta_y/D$. The quantities, $V_c$, $\rho_c$, $\delta_y$, $\delta_x$ and $\Delta T$ are the characteristic velocity, density, length scales (in x- and y-directions) and temperature difference, respectively. The fluid properties, $\mu$, $c_v$, k and D are the molecular viscosity, specific heat at constant volume, thermal conductivity and the mass diffusivity, respectively.

Boundary conditions must be specified in order to close the system of equations. The temperature of the argon at the inlet to the duct was set to ambient (295° K.) and the inlet velocity was given various values to obtain a range of inlet flow rates. The velocity was set to zero and the temperature set to ambient at all solid walls. A range of values was considered for the pressure at the outlet in the lower chamber, $p_w$. The pressure at the upper chamber outlets was set to a low value (0.0075 torr). This pressure is actually expected to vary depending on the type of vacuum pumps used and the flow rate entering the upper chamber. The pressure in the upper chamber is expected to be sufficiently small to result in a choked flow condition (Mach number equal to one) at the aperture in the partition. The mass flow rate into the upper chamber is independent of the pressure there when the flow is choked, so the exact value is not important. The results for the flow rate and mass fraction of hydrocarbon entering the upper chamber obtained from the calculations were used along with a candidate value for the vacuum pump throughput to obtain the hydrocarbon partial pressure in the upper chamber, as described below.

The wafer out gassing rate was conservatively specified to be $10^{14}$ molecules/(second·cm$^2$). This out gassing rate is expected to be greater than that which will occur in EUVL. The hydrocarbon was assumed to be methane, and argon was used for the gas curtain in most of the calculations. The properties used are $\mu$=2.281 e$^{-5}$ Kg/(m s) C$_v$=319 J/(Kg K), k=0.018 W/(mK) and D=3.283 Kg/m s). The calculations were carried out to a steady state. A standard, commercially available simulation software was used for all the calculations.

The vacuum pump throughput is given by the product of the volumetric flow rate of gas through the pump and the pressure at the pump inlet. The throughput is approximately constant for many turbo-molecular pumps over a wide range of inlet pressures. Given the mass flow rate of gas entering the upper chamber from the gas curtain, $m_0$, and given the pump throughput, Q, Equation 5 gives the pressure at the pump inlet, $p_0$, where R is the gas constant for the gas mixture and T is the gas temperature assumed to be equal to the ambient value (295° K.). In a preferred embodiment, two turbo-molecular pumps are positioned in the upper chamber to provide a total value of Q of 6000 torr·1/sec. The pressure in the upper chamber was assumed to be uniform and equal to $p_0$. Equation 6 is used to obtain the hydrocarbon mole fraction, $x_0$, from the hydrocarbon mass fraction, $y_0$, of the flow entering the upper chamber, where $W_A$ and $W_{HC}$ are the molecular weights of argon and the hydrocarbon (methane), respectively. The hydrocarbon partial pressure in the upper chamber, $p_{HC}$, is given by the product of $p_0$ and $x_0$.

$$p_0 = RTm_0/Q \quad \quad 5$$

$$x_0 = \frac{W_A}{W_{HC}} y_0 / \left[1 - y_0\left(1 - \frac{W_A}{W_{HC}}\right)\right] \quad \quad 6$$

FIG. 4 shows simulated streamlines in the vacuum enclosure which indicate the flow path of the argon/hydrocarbon gas mixture 80. As is apparent, some of the gas 82 flows into the upper chamber and exits through the upper outlets while the remainder of the gas 81 exits through the lower outlet. The gas flowing into the upper chamber is nearly pure argon, i.e., most of the hydrocarbon flows out through the lower outlet as intended. The gas flowing into the upper chamber is driven by a localized region of high pressure which develops in the rather confined region between the wafer and the partition. The Knudsen number of the flow over the wafer, which is given by the ratio of the molecular mean free path and the gap distance between the wafer and partition, ranged from 0.02 to 0.04 in the calculations carried out here which are very close to the continuum regime so the use of the continuum equations should result in only a small error.

The flow field shown in FIG. 4 has important implications regarding particle transport. For calculations based on empirical data for the drag coefficient on particles in low pressure gases, particles are likely to follow the gas flow even at the low pressures considered here. That is, the flow field shown in FIG. 2 may be effective in sweeping particles out of the vacuum enclosure.

The distribution for the hydrocarbon mass fraction in the vicinity of the wafer is shown in FIG. 5. These results show that the argon gas, which is flowing from left to right, is effective in sweeping the hydrocarbon gas to the right and out of the vacuum enclosure. A region of gas with a larger concentration of hydrocarbon (shown as the dark region(s)) develops between the argon inlet duct and the wafer on the left side. The hydrocarbon is primarily restricted to a region along the surface of the wafer. Note that this hydrocarbon gas is prevented from entering the upper chamber by the partition.

Results for the hydrocarbon partial pressure in the upper chamber, $p_{HC}$, as a function of the argon flow rate in the gas curtain (the corresponding value of the mass transfer Peclet number is also shown) are shown in FIG. 6 for $h_r$=1.4 cm. $p_{HC}$ decreases with increasing argon flow rate, and a value of $10^{-10}$ torr for $p_{HC}$ (our target value) can be obtained with an argon flow rate of 12.2 torr·1/sec.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An apparatus for forming an optical image of a mask pattern on a wafer that comprises:
   a first chamber housing a wafer to be exposed to extreme ultraviolet (EUV) radiation to form a pattern image on the wafer;
   a second chamber that is separated from the first chamber by a partition which defines an aperture that is permeable to inert gas and that houses an image system, which is disposed between the mask having a pattern for circuit manufacturing and the wafer, for receiving EUV radiation reflected from the mask and directing it to the wafer through the aperture; and
   means for maintaining a flow of inert gas over the wafer surface to remove contaminants that develop from the wafer upon exposure to the EUV radiation.

2. The apparatus of claim 1 wherein the means for maintaining the flow of inert gas establishes a gaseous flow rate to achieve a mass transfer Peclet number between 20 and 35.

3. The apparatus of claim 1 wherein the means for maintaining a flow of inert gas comprises a source of inert gas that delivers a stream of inert gas to the surface of the wafer below the aperture.

4. The apparatus of claim 3 wherein the aperture defines an opening on the lower surface the partition that has an area of 1 cm$^2$ to 5 cm$^2$.

5. The apparatus of claim 4 wherein the opening defines a slit that has a width of 0.4 cm to 1.5 cm and a length of 2.6 cm to 3.7 cm.

6. The apparatus of claim 1 further comprising vacuum means for supplying a vacuum to the second chamber.

7. The apparatus of claim 1 wherein the first chamber includes a source of inert gas having an inlet at a first side of the first chamber and an outlet at a second side of the first chamber that is substantially opposite that of the inlet.

8. The apparatus of claim 1 wherein the inert gas comprises helium, argon, hydrogen, oxygen and mixtures thereof.

9. The apparatus of claim 1 wherein the contaminants comprise hydrocarbons.

10. The apparatus of claim 1 wherein the second chamber comprises a second outlet through which part of the inert gas and contaminants exit.

11. A method for forming an optical image of a mask pattern on a wafer that comprises the steps of:
   (a) providing a photolithographic system that comprises:
      (i) a first chamber housing a wafer that is sensitive to extreme ultraviolet (EUV) radiation and which is to be exposed to EUV radiation to form a pattern image on the wafer; and
      (ii) a second chamber that is separated from the first chamber by a partition which defines an aperture which is permeable to inert gas and that houses an image system, which is disposed between the mask having a pattern for circuit manufacturing and the wafer;
   (b) exposing the mask to EUV radiation which is at least partially reflected onto a surface of the wafer, to form a pattern image on the wafer surface; and
   (c) maintaining a flow of inert gas over the wafer surface to remove contaminants that develop from the wafer upon exposure to the EUV radiation.

12. The method of claim 11 wherein the flow of inert gas to achieve a mass transfer Peclet number between 20 and 35.

13. The method of claim 11 wherein the means for maintaining a flow of inert gas comprises a source of inert gas that delivers a stream of inert gas to the surface of the wafer below the aperture.

14. The method of claim 13 wherein the means for maintaining the flow of inert gas establishes a gaseous flow rate to achieve a mass transfer Peclet number between 20 and 35.

15. The method of claim 14 wherein the aperture defines an opening on the lower surface the partition that has an area of 1 cm$^2$ to 5 cm$^2$.

16. The method of claim 11 further comprising the step of supplying a vacuum to the second chamber.

17. The method of claim 11 wherein the first chamber includes a source of inert gas having an inlet at a first side of the first chamber and an outlet at a second side of the first chamber that is substantially opposite that of the inlet.

18. The method of claim 11 wherein the inert gas comprises helium, argon, hydrogen, oxygen and mixtures thereof.

19. The method of claim 11 wherein the contaminants comprise hydrocarbons.

20. The method of claim 11 wherein the second chamber includes a second outlet through which part of the inert gas and contaminants exit.

21. A process for fabrication of a device comprising at least one element having a dimension $\leq 0.25$ μm, such process comprising construction of a plurality of successive levels, construction of each level comprising lithographic delineation, in accordance with which a subject mask pattern is illuminated to produce a corresponding pattern image on the device being fabricated, ultimately to result in removal of or addition of material in the pattern image regions, in which illumination used in fabrication of at least one level is extreme ultra-violet radiation, characterized in that the process employs a chamber that houses a wafer that is exposed to extreme ultraviolet radiation to form a pattern image on the wafer wherein the chamber has a partition that has an aperture through which the radiation enters the chamber, wherein the partition and surface of the wafer define a path, and wherein a flow of inert gas is maintained along the path and over the wafer surface to remove contaminants that develop from the wafer upon exposure to the radiation.

22. The process of claim 21 in which lithographic delineation is by projection.

23. The process of claim 22 in which projection comprises ringfield scanning comprising illumination of a straight or arcuate region of a projection mask.

24. The process of claim 22 in which projection comprises reduction ringfield scanning in accordance with which an imaged arcuate region on the image plane is of reduced size relative to that of the subject arcuate region so that the imaged pattern is reduced in size relative to the mask region.

25. The process of claim 21 wherein the flow of inert gas has a gaseous flow rate to achieve a mass transfer Peclet number between 20 and 35.

\* \* \* \* \*